United States Patent [19]
Frankeny et al.

[11] Patent Number: 5,121,299
[45] Date of Patent: Jun. 9, 1992

[54] MULTI-LEVEL CIRCUIT STRUCTURE UTILIZING CONDUCTIVE CORES HAVING CONDUCTIVE PROTRUSIONS AND CAVITIES THEREIN

[75] Inventors: Richard F. Frankeny, Elgin; Karl Hermann, Austin, both of Tex.

[73] Assignee: International Business Machines Corporation, Armonk, N.Y.

[21] Appl. No.: 459,087

[22] Filed: Dec. 29, 1989

[51] Int. Cl.$^5$ ............................................. H05K 1/08
[52] U.S. Cl. .................................... 361/413; 174/261; 361/388; 361/396; 361/414; 439/74
[58] Field of Search ............................ 361/386–388, 361/400, 403, 405, 406, 411, 412, 413, 414, 396, 398; 357/81; 165/80.3, 185; 174/252, 255, 257, 259, 260, 261, 262; 439/65, 66, 74; 427/96, 97; 428/212, 901, 323, 335; 29/830, 831, 843, 846, 853

[56] References Cited

U.S. PATENT DOCUMENTS

| | | | |
|---|---|---|---|
| 3,436,819 | 4/1969 | Lunine | 174/261 |
| 3,606,677 | 9/1971 | Ryan | 174/259 |
| 3,795,047 | 3/1974 | Abolafia | 174/257 |
| 4,074,342 | 2/1978 | Horn | 361/411 |
| 4,191,789 | 3/1980 | Brown | 427/97 |
| 4,496,793 | 1/1985 | Hanson | 174/259 |
| 4,617,730 | 10/1986 | Geldermans | 174/259 |
| 4,882,454 | 11/1989 | Peterson | 361/414 |
| 4,908,940 | 3/1990 | Amano | 29/852 |
| 4,963,697 | 10/1990 | Peterson | 361/414 |
| 4,967,314 | 10/1990 | Higgins | 361/414 |

*Primary Examiner*—Gerald P. Tolin
*Attorney, Agent, or Firm*—Andrew J. Dillon

[57] ABSTRACT

A multi-level circuit structure is provided which includes a plurality of overlying substrates, each having at least one conductive core. A plurality of imprinted depressions are formed in each substrate, each depression having a convex surface and a concave surface. Dielectric coatings are utilized to provide insulation between adjacent substrates and by selectively placing a conductive mass between selected overlying imprinted depressions an electrical connection may be formed between adjacent imprinted depressions wherein selected portions of one substrate may be electrically coupled to selected portions of a second substrate.

17 Claims, 4 Drawing Sheets

MULTI-LEVEL CIRCUIT STRUCTURE UTILIZING CONDUCTIVE CORES HAVING CONDUCTIVE PROTRUSIONS AND CAVITIES THEREIN

BACKGROUND OF THE INVENTION

1. Technical Field

The present invention relates in general to a multi-level circuit structure for mounting electronic devices thereon. More particularly, the present invention relates to methods for construction of multi-level circuit cards formed from a plurality of substrates having electrically conductive cores. Still more particularly, the present invention relates to methods for construction of multi-level circuit cards formed from a plurality of substrates having electrically conductive cores which permit accurate alignment of each level within the multi-level circuit card.

2. Description of the Related Art

In electronic computers, electronic devices or modules housing electronic devices, are mounted on circuit cards which electrically interconnect the various electronic devices and modules. Multi-layer circuit cards are conventionally manufactured by laminating together a number of substrates, i.e. epoxy-fiberglass, having copper circuitry on each side. The multi-layer laminate is then drilled to form the many interconnections or "vias" which are necessary for interlayer connection. Registration of the cores must be extremely precise because misalignment will lead to an unusable circuit card.

U.S. Pat. No. 3,606,677 describes a multi-layer structure formed by laminating dielectric substrates having conductive patterns thereon with unmetalized substrates therebetween.

U.S. Pat. No. 3,795,047 describes a multi-layer structure which is formed by laminating subassemblies which are electrically interconnected by uniform spherical particulate powder embedded in an epoxy between adjacent layers.

U.S. Pat. No. 4,683,653 describes a multi-layer circuit board which is formed from laminated dielectric base plates with circuit patterns disposed thereon.

U.S. Pat. No. 3,436,819 describes a multi-layer circuit board formed from laminating circuitized dielectric substrates.

U.S. Pat. No. 4,496,793 describes a multi-layer circuit board which includes one or more metal stabilizing sheets for adjusting the thermal coefficient of expansion of the laminate.

U.S. patent application Ser. No. 07/339,384 assigned to the assignee herein discloses a multi-level structure which includes layers which are formed from thermally and/or electrically conductive core materials which are coated with a dielectric material. By utilizing a thermally and/or electrically conductive core each substrate in a multi-level circuit card formed in this manner will have increased structural stability. By forming structures from multiple substrates, each having an enhanced structural stability, the resultant multi-level circuit card will have greatly enhanced structural stability. Additionally, where the core of each substrate is electrically conductive, the core may be used as a ground or power plane, thereby eliminating the need to separately include a conductive layer or sheet as a ground or power plane. A problem which exists with each of the aforementioned prior art structures is the particularly precise registration which is required of each layer during construction so that interconnections which are drilled through multiple layers will intersect the various conductive patterns at precise points.

It should therefore be apparent that a need exists for a multi-level circuit card structure which permits accurate registration of multiple levels within the structure.

SUMMARY OF THE INVENTION

It is therefore one object of the present invention to provide and improved multi-level circuit card structure and method for construction thereof.

It is another object of the present invention to provide an improved multi-level circuit card structure which is formed from a plurality of substrates each having a thermally and/or electrically conductive core contained therein.

It is yet another object of the present invention to provide an improved multi-level circuit card structure which is formed from a plurality of substrates having thermally and/or electrically conductive cores which permits accurate registration between cores during construction thereof.

The foregoing objects are achieved as is now described. The multi-level circuit card structure of the present invention includes a plurality of overlying substrates, each having at least one conductive core disposed therein. A plurality of imprinted depressions are formed in each substrate, each depression having a convex surface and a concave surface Dielectric coatings are utilized to provide insulation between adjacent substrates and by selectively placing a conductive mass between selected imprinted depressions an electrical connection may be formed with an adjacent imprinted depression wherein selected portions of one substrate may be electrically coupled to selected portions of a second substrate.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

DETAILED DESCRIPTION OF THE PREFERRED EMBODIMENT

Figure 1:
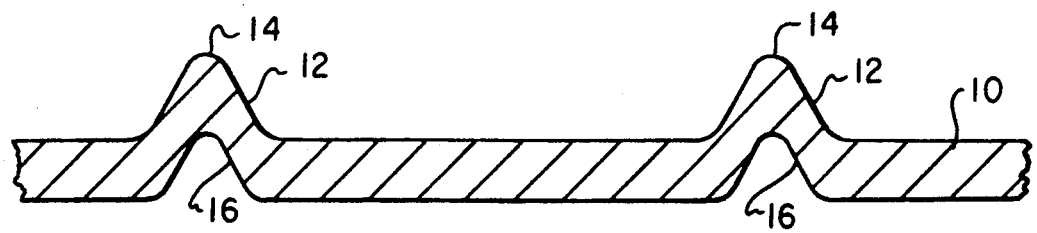
FIGS. 1-11 depict a series of sectional views illustrating the construction of one layer of a multi-level circuit card, in accordance with the method of the present invention.

With reference now to the figures and in particular with reference to FIG. 1, there is depicted a sectional view illustrating the construction of one layer of a multi-level circuit card in accordance with the method of the present invention. As may be seen, the construction of a single layer of the multi-level circuit card of the present invention, begins by utilizing an electrically conductive core 10. Preferably conductive core 10 is constructed of a metallic material, such as copper, aluminum, iron or the like, or a composite metallic material such as copper-invar-copper.

In a preferred embodiment of the present invention, conductive core 10 is chosen to give each substrate a thermal coefficient of expansion which closely matches that of the material from which an electronic device mounted to the substrate is fabricated from. Typically, electronic devices are fabricated from a material like silicon, or gallium arsenide. In the case of a silicon electronic device, conductive core 10 can provide a thermal coefficient of expansion which closely matches that of silicon by utilizing copper-invar-copper or molybdenum.

By providing conductive core 10 with a thermal coefficient expansion which closely matches that of the electronic devices to be mounted thereon, it is possible to permit such devices to be directly attached to the multi-layer circuit card without reliability concerns which may result from a thermal mismatch between the electronic device and the multi-layer circuit card.

As is illustrated, conductive core 10 includes a plurality of imprinted depressions 12 which are constructed utilizing a punch or die. Each imprinted depression 12 preferably includes a convex surface 14 and a concave surface 16. In the depicted embodiment of the present invention, conductive core 10 is preferably provided utilizing a material which is between one and two mils in thickness. Each imprinted depression 12 is preferably extruded from the surface of conductive core 10 to a distance of approximately four mil, or approximately twice the thickness of conductive core 10.

Figure 2:
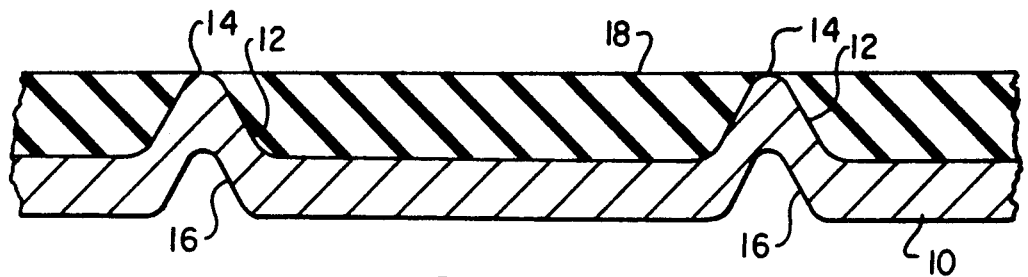

Next, referring to FIG. 2, there is depicted a sectional view which depicts the next step in the construction of a layer of a multi-level circuit card which is constructed in accordance with the method of the present invention. As is illustrated, after imprinting conductive core 10 with a plurality of imprinted depressions 12, the side of conductive core 10 having dimples extruding therefrom is knife coated with a dielectric material. The dielectric material selected is preferably a polymer, a ceramic material or any other suitable dielectric material. Examples of polymer materials are polyimide, mylar, polyetherimide, polytetrafluoroethylene, epoxy (FR4) and bismaleimide resins. In the preferred embodiment of the present invention, dielectric material 18 is implemented utilizing polyimide. The layer of dielectric material 18 is then knife coated onto conductive core 10 to ensure that the coating thickness will be limited to the height of convex surface 14 of each imprinted depression 12. Thereafter, dielectric material 18 is cured, utilizing any technique well known in the art. Alternatively, a photo-imageable dielectric material may be utilized and "curtain coated" onto conductive core 10. Thereafter, the photo-imageable material may be exposed and developed to expose each convex surface 14.

Figure 3:
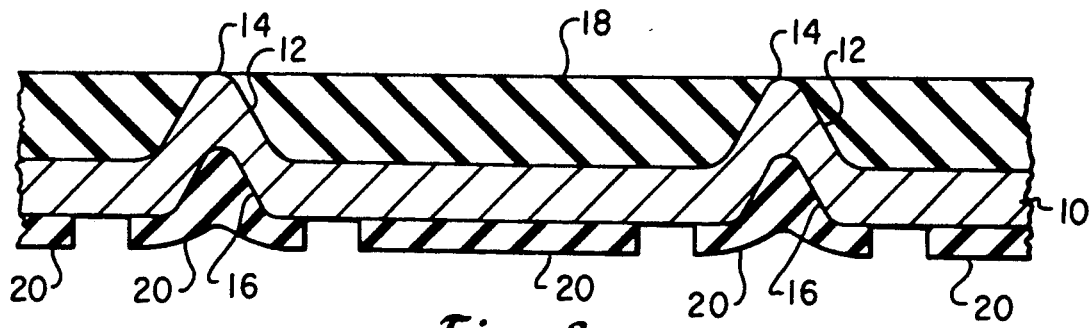

With reference now to FIG. 3, the next step in the process of constructing one layer of a multi-level circuit card in accordance with the method of the present invention is depicted. As is illustrated in FIG. 3, the lower surface of conductive core 10 is now coated with a suitable photo-resist 20 which is exposed, developed and rinsed in a manner well known in the art to expose rings around selected imprinted depressions 12 which will be utilized to create isolated interconnections or "vias." As discussed above with respect to FIG. 2, in an alternative embodiment a photo-imageable dielectric material may be curtain coated onto the lower surface of conductive core 10 and exposed and developed to expose rings around each imprinted depression 12.

Figure 4:
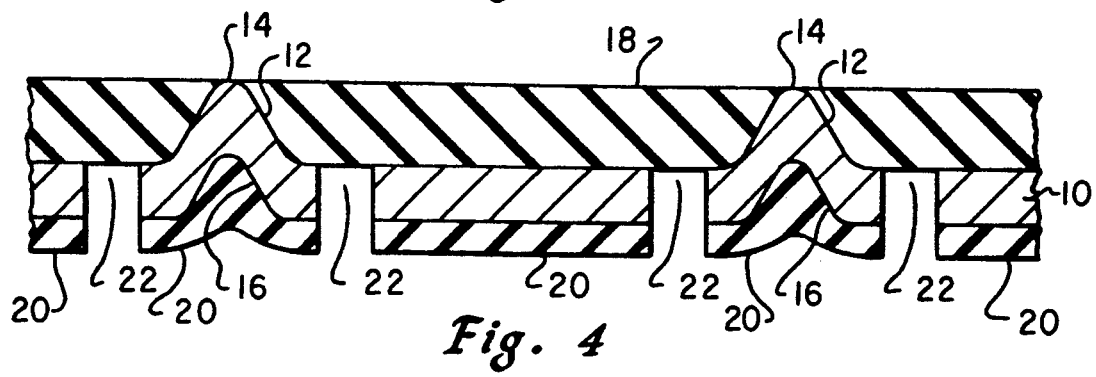

Referring now to FIG. 4, the next step in the process is illustrated. As is depicted, a plurality of isolation rings 22 have been etched into conductive core 10 to isolate selected imprinted depressions 12. In this manner, individual imprinted depressions may be electrically isolated from the remainder of conductive core 10 in order to provide an isolated via, when a multi-level circuit card is constructed, in a manner which will be explained in greater detail herein.

Figure 5:
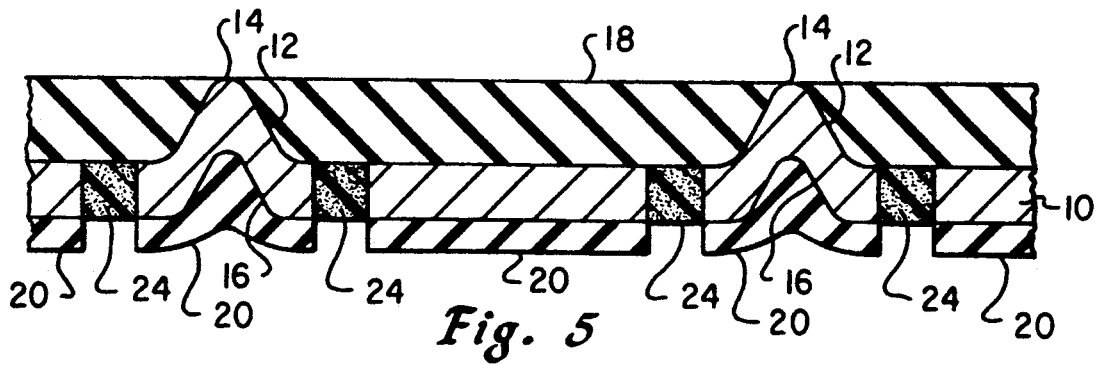

Next, with reference to FIG. 5, another step in the process of the construction of a layer of a multi-level circuit card is illustrated. While photo-resist layer 20 is still in place, the layer illustrated and constructed thus far is placed in an electrophoretic bath and the etched isolation rings 22 are electro-deposition coated to seal and give strength to isolation rings 22. By using electro-deposition techniques, isolation rings 22 are filled partially with epoxy 24 and during a subsequent cure cycle each isolation ring 22 will achieve a smooth although somewhat recessed fill of epoxy 24, thereby adding additional strength to the layer thus constructed.

Figure 6:
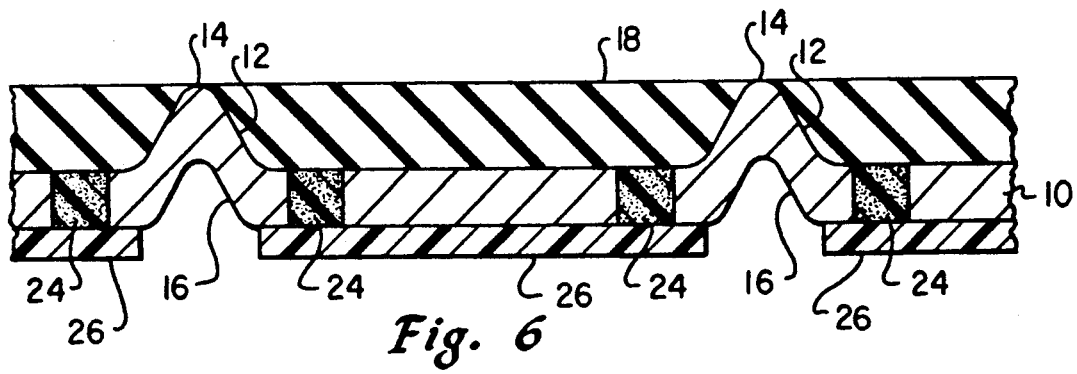

Referring now to FIG. 6, the next step in the process of constructing a single layer of the multi-layer circuit card of the present invention is depicted. As is illustrated, photo-resist layer 20 has been removed by conventional means and a photo-sensitive solder mask 26, is applied to the underside of conductive core 10. Photo-sensitive solder mask layer 26 is then exposed and developed utilizing conventional photolithographic techniques to selectively expose concave surface 16 of selected imprinted depressions 12.

Figure 7:
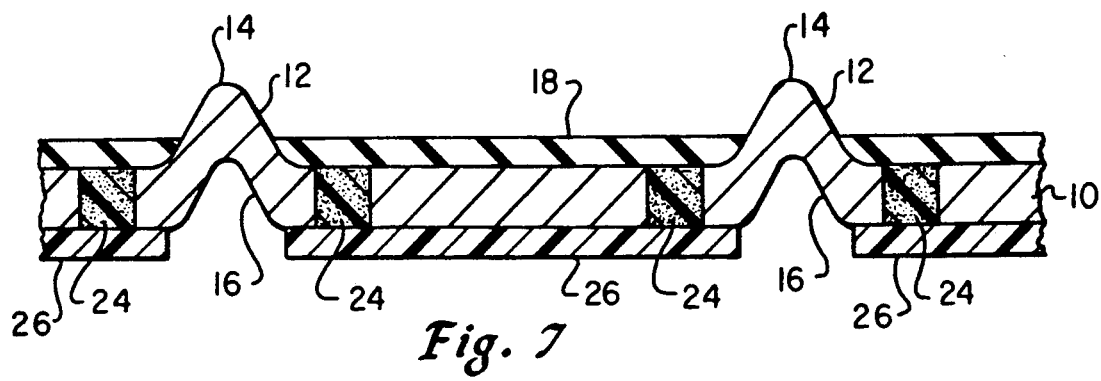

With reference now to FIG. 7, the next step in the process of creating one layer of the multi-level circuit card in accordance with the method of the present invention is illustrated. As illustrated in FIG. 7, dielectric layer 18 is reactive ion etched (RIE) to diminish the thickness of dielectric layer 18. In this manner, each convex surface 14 of an imprinted depression 12 is exposed. This technique is an essential step in the method of the present invention wherein each convex surface 14 of an imprinted depression 12 may be utilized to provide electrical contact between adjacent conductive cores 10 upon the assemblage of multiple conductive cores 10 into a multi-layer circuit card.

Figure 8:
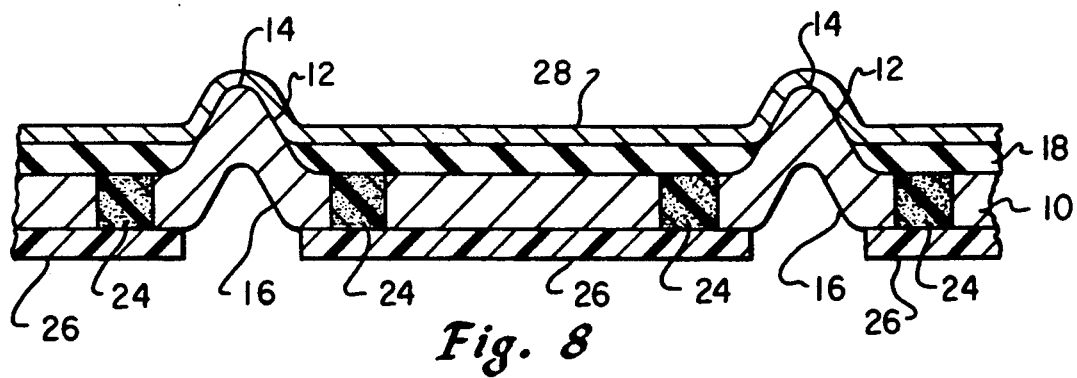

Referring now to FIG. 8, the next step in the process of constructing one layer of a multi-level circuit card constructed in accordance with the method of the present invention is depicted. As is illustrated, the upper surface of conductive core 10 is now coated with a uniform plating of a metallic material such as copper.

This is accomplished by seeding dielectric material 18 with a suitable seedable material such as platinum, palladium, nickel, or the like. The preferred seed material is palladium. U.S. patent application Ser. No. 07/290,486, filed on Dec. 23, 1988, to Viehbeck, et al., entitled "Method for Conditioning on Organic Polymeric Material" describes electrochemical and chemical methods for seeding a polymeric material, in particular a polyimide material with a seed material such as palladium. The teaching contained within the aforementioned patent application is incorporated herein by reference thereto. The process according to Viehbeck, et al. is a method for conditioning at least one surface of an organic polymeric material that is capable of transporting electrons and counter ions in a reversible manner. The process comprises applying electrons to redox sites, i.e., sites which may undergo reduction and oxidation, of the polymeric material with concurrent uptake of counter ions from the electrolyte. The reduced polymeric material is then placed into contact with a solution that contains cations of a metal which will diffuse into the organic polymeric material and contact the redox sites thereof. Metal deposited in such a manner can mediate continued electron transfer of the polymer resulting in further metal deposition under the previously deposited metal. The redox sites thereby transfer electrons to the cations which is energetically disposed to receiving electrons from the redox sites to thereby reduce the cation to metal atoms in the zero oxidation state. Next, a second metal is deposited from the electrolysis plating bath onto the zero oxidation state metal.

The electrons are supplied to the redox sites of the polymeric material by either means of a cathode in an electrochemical circuit, the potential applied to the cathode being equal to or negative of the reduction potential of the polymer or preferably by means of a reducing agent and solution, the oxidation potential of the reducing agent being negative with respect to the reduction potential of the polymer. Alternatively, the electrons may be supplied to the redox sites of the polymeric material by contacting the polymeric material with tetrakis (dimethylamino) ethylene. The reducing agent may be in a charged or neutral form. The polymer must possess chemical functionality who's reduction potential is negative relative to the reduction potential of the metal ions. A suitable reducing agent for conditioning the polymer surface is a benzophenone radical, an ion in acetonitrile containing tetrabutylammonium fluoroborate as an electrolyte. The foregoing is only one example of a technique which may be utilized. Other seeding techniques commonly known in the art may also be utilized.

Next, by means commonly known in the art, another metal layer is electrolessly deposited onto the seed layer to form a plating base. Metals such as copper, gold, silver, nickel and the like may be electrolessly deposited onto the seed layer. The thickness of the electrolessly deposited metal is typically from about 0.1 micron to about 10 microns.

In the depicted embodiment of the present invention, copper plate 28 will be utilized to form the circuit lines and points of interconnection between this layer of the multi-level circuit card of the present invention and a second layer. In a preferred embodiment of the present invention, copper plate 28 is approximately eight microns in thickness.

Figure 9:
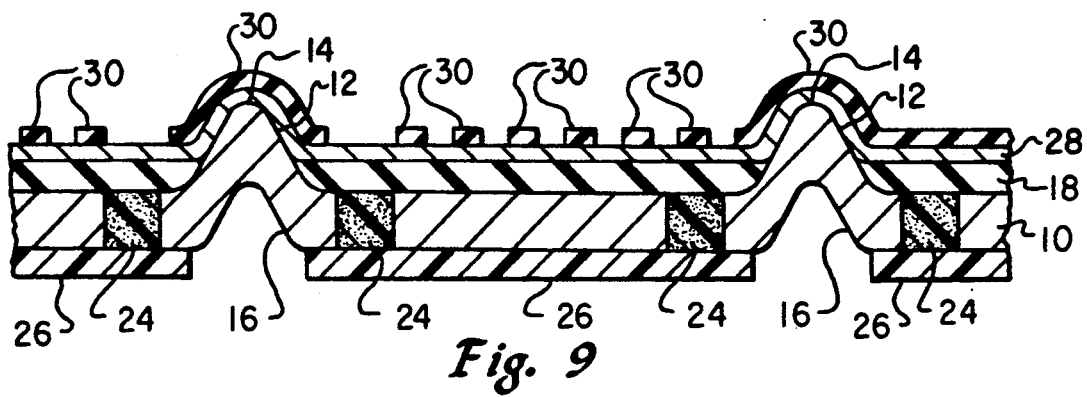

The next step in the process of constructing one layer of a multi-level circuit card in accordance with the method of the present invention is illustrated in FIG. 9, wherein copper layer 28 is coated with an appropriate photo-resist material 30. Photo-resist material 30 is then exposed and developed to generate desired circuit lines and points of interconnection within copper plate 28. Of course, pattern plating or electroless plating may also be utilized to generate desired circuit lines and points of interconnection.

Figure 10:
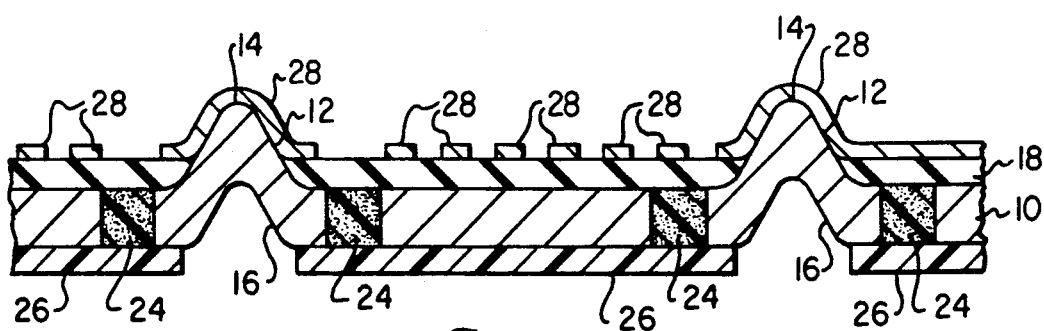

Referring now to FIG. 10, the resultant circuit lines and points of interconnection which were formed with copper plate 28 are illustrated. Those skilled in the art will appreciate that copper plate 28 is etched into the desired circuit lines and points of interconnection by applying an appropriate etchant to those areas of copper plate 28 which are not protected by photo-resist layer 30, in accordance with known techniques in this art.

Figure 11:
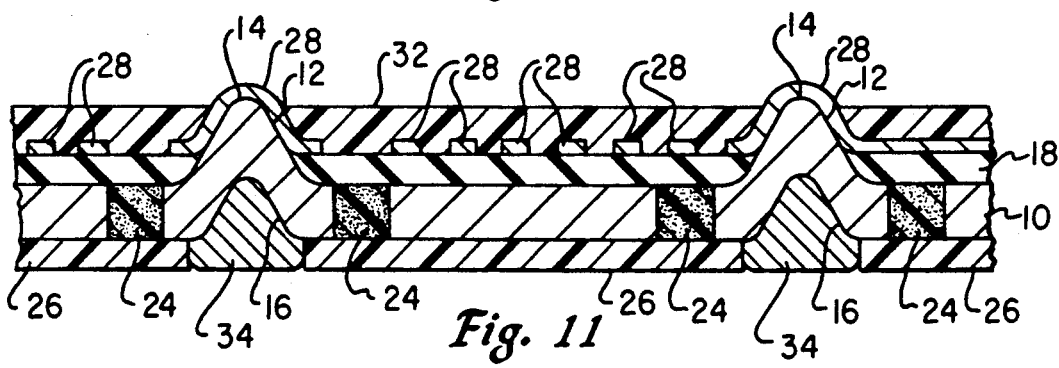

Finally, as depicted in FIG. 11, the circuitry side of conductive core 10 is coated with a photo-sensitive solder mask 32 and each section of copper plate 28 which covers a convex surface 14 of an imprinted depression 12 is exposed through photo-sensitive solder mask 32. Similarly, a conductive paste 34 is utilized to fill selected concave surfaces 16 of certain imprinted depression 12. Thus, those skilled in the art will appreciate that it will be possible to generate a conductive path from conductive paste 34 through that portion of conductive core 10 which forms imprinted depression 12, and thereafter through a portion of copper plate 28 which has been plated onto the convex surface 14 of an imprinted depression 12.

Figure 12:
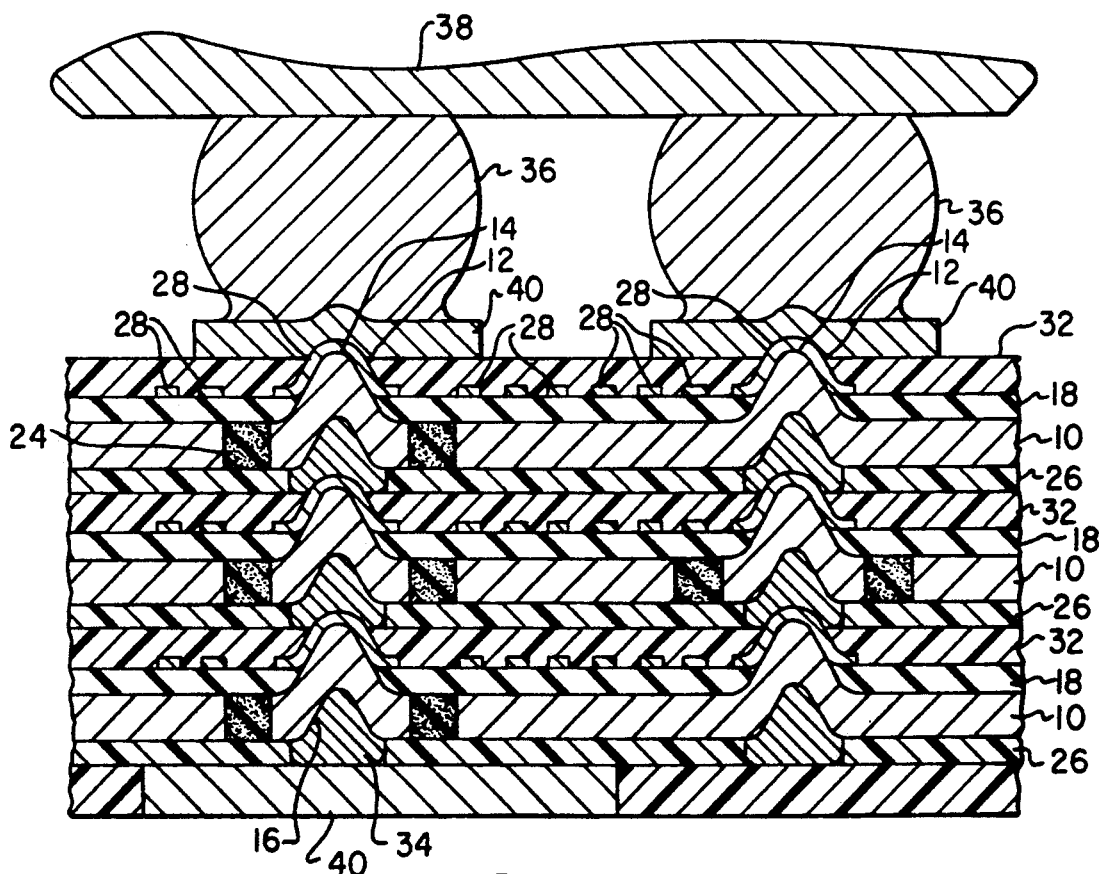
FIG. 12 depicts a portion of a multi-level circuit card constructed in accordance with the method of the present invention with an electronic device mounted thereon.

Referring now to FIG. 12, there is depicted a portion of a multi-level circuit card which as been constructed in accordance with the method of the present invention with an electronic device mounted thereon. As is illustrated, this higher level structure 50 has been created by stacking a plurality of single layers which have been constructed in accordance with the method illustrated in FIGS. 1-11. In the manner depicted, a plurality of conductive pads 40 may be mounted to the upper surface of multi-level circuit card 50, in electrical contact with selected convex surfaces 14 of imprinted depressions 12.

Next, one technique for electrically interconnecting an electronic device or chip 38 to multi-level circuit card 50 is depicted. The technique illustrated for connecting chip 38 to multi-level circuit card 50 utilizes a plurality of solder balls 36 in a manner which is commonly known in the art of solder reflow as controlled collapse chip connection (C4) technology. U.S. Pat. Nos. 3,401,126 and 3,429,040 to Lewis F. Miller and assigned to the assignee of the present application disclose the technique whereby the controlled collapse chip connection technique of face down bonding of a semiconductor chip to a carrier may be established. The technique described in the Miller patents is directly applicable to the mounting technique depicted in FIG. 12 and the teachings of those patents are incorporated herein by reference thereto. Additionally, those skilled in the art will appreciate that conductive paste may be utilized to attach chip 38 to multi-level circuit card 50.

Again, in general, the techniques described in the Miller patents disclose the formation of a malleable pad of metallic solder on the semiconductor device contact site and the solder joinable sites on the conductors of the chip carrier. The device carrier solder joinable sites are surrounded by non-solderable barriers such that when the solder on the semiconductor device contacts sites melts, surface tension will hold the semiconductor device suspended above the carrier. Similarly, a conductive pad 40 may be mounted to the lower surface of multi-level circuit card 50 so that surface mount devices may be mounted to that layer.

One key characteristic of a multi-level circuit card which has been constructed in accordance with the method of the present invention is that the compressive nature of conductive paste 34 within each concave surface 16 of an imprinted depression 12 in combination with the exposed convex surface 14 of each imprinted depression 12 means that the multiple layers of multi-level circuit card 50 will fit together much like a ball and socket. Thus, the problem noted in prior art multi-level circuit cards of accurate registration is minimized by providing the structure of the present invention in a manner which not only does not require drilling through multiple layers but also makes accurate registration much more simple to accomplish in view of this ball and socket arrangement. Thus, it should be apparent those skilled in the art upon reference to FIG. 12 that multi-level circuit card 50 has been created which includes three signal planes and three power planes. Of course, different combinations of signal and power planes are possible.

Figure 13:
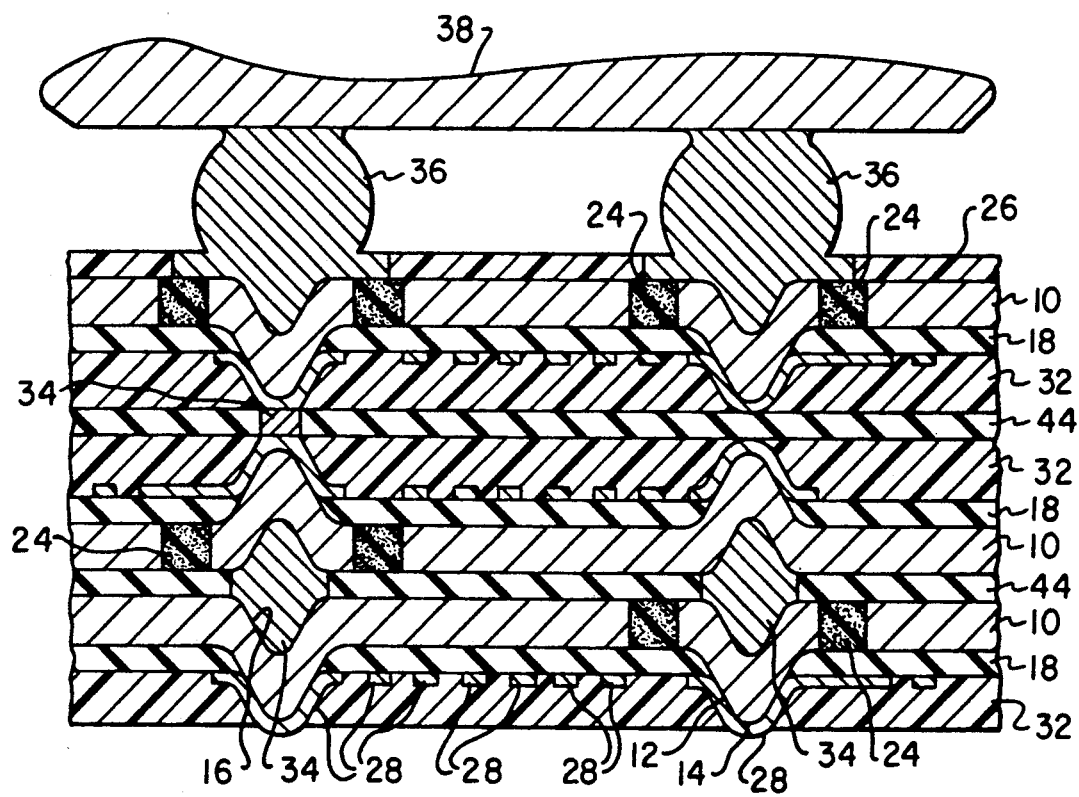
FIG. 13 depicts a portion of a second embodiment of a multi-level circuit card constructed in accordance with the method of the present invention with an electronic device mounted thereon.

Finally, with reference to FIG. 13, there is depicted a portion of a second embodiment of a multi-level circuit card 50 which may be constructed in accordance with the method of the present invention. As is illustrated in FIG. 13, multi-level circuit card 50 depicted therein is again constructed utilizing three single layers which have been constructed in accordance with the method depicted in FIGS. 1-11. However, unlike multi-level circuit card 50 depicted in FIG. 12, in which each conductive core 10 is situated with the convex surfaces 14 of each imprinted depression 12 on the upper surface thereof, in depicted multi-level circuit card 50 of FIG. 13, one or more conductive cores 10 are positioned with the convex surface 14 of imprinted depression 12 oriented in a downward manner.

In this embodiment, a mass of conductive paste 34 is preferably utilized to create a conductive path between two concave surfaces 16 of imprinted depressions 12, between the two lowermost conductive cores 10. An additional layer of dielectric material 44 is provided at several levels to create additional insulation between adjacent conductive cores 10. A second conductive mass 42 is also utilized to create a conductive path between these portions of copper plate 28 which are mounted to two convex surfaces 14 of two imprinted depressions 12. In this manner, solder balls 36 may be simply and easily placed within conductive paste 34 in the uppermost concave surfaces 16 of imprinted depressions 12 to provide a manner of mounting chip 38.

While the invention has been particularly shown and described with reference to a preferred embodiment, it will be understood by those skilled in the art that various changes in form and detail may be made therein without departing from the spirit and scope of the invention.

We claim:

1. A multi-level circuit card structure comprising:
   a plurality of overlying substrates, each having at least one electrically conductive core, and at least one layer of dielectric material;
   a plurality of imprinted depressions formed within each of said electrically conductive cores and selectively disposed in overlying relationships in each of said electrically conductive cores, each imprinted depression having a convex surface and a concave surface; and
   conductive means disposed within said concave surface of selected imprinted depressions within a first of said plurality of substrates and above said convex surface of selected imprinted depressions within a second of said plurality of substrates wherein a portion of one of said electrically conductive cores may be electrically connected with a portion of a second electrically conductive core.

2. A multi-level circuit card structure according to claim 1 wherein said conductive means disposed between selected imprinted depressions within a first of said plurality of substrates and selected imprinted depressions within a second of said plurality of substrates comprises conductive means disposed between the concave surfaces of selected imprinted depressions within a first of said plurality of substrates and convex surfaces of selected imprinted depressions within a second of said plurality of substrates.

3. The multi-level circuit card structure according to claim 1 wherein said at least one electrically conductive core is thermally conductive.

4. The multi-level circuit card structure according to claim 1 further including an electrical device electrically mounted onto said structure.

5. The multi-level circuit card structure according to claim 1 wherein said at least one electrically conductive core comprises a layer of copper-invar-copper.

6. The multi-level circuit card structure according to claim 1 further including a coating of dielectric material upon at least one of said overlying substrates.

7. The multi-level circuit card structure according to claim 6 wherein said dielectric material is a polymeric material.

8. The multi-level circuit card structure according to claim 7 wherein said polymeric material is selected from the group including a polyimide and a fluropolymer.

9. The multi-level circuit card structure according to claim 1 wherein said convex surface of each of said imprinted depressions comprises at least a one mil extrusion from the surface of said electrically conductive core.

10. The multi-level circuit card structure according to claim 2 wherein said conductive means comprises a conductive paste disposed within the concave surface of selected imprinted depressions.

11. A substrate for utilization in the construction of a multi-level circuit card, said substrate comprising:
    a single conductive core having a substantially planar surface;
    a coating of dielectric material upon a first surface of said single conductive core;
    at least one conductive layer formed upon said coating of dielectric material; and
    a plurality of protrusions formed within said single conductive core, each of said plurality of protrusions having a convex surface extending outward from said first surface of said single conductive core beyond said coating of dielectric material and having a corresponding concave surface underlying said convex surface.

12. The substrate for utilization i the construction of a multi-level circuit card according to claim 11, further including a second coating of dielectric material upon a second surface of said single conductive core.

13. The substrate for utilization i the construction of a multi-level circuit card according to claim 12, further including an aperture within said coating of dielectric material surrounding each of said corresponding concave surfaces underlying each of said convex surfaces.

14. The substrate for utilization in the construction of a multi-level circuit card according to claim 11, wherein at least one of said plurality of protrusions is electrically isolated from said single conductive core.

15. The substrate for utilization in the construction of a multi-level circuit card according to claim 11, wherein said single conductive core comprises a layer of copper-invar-copper.

16. The substrate for utilization in the construction of a multi-level circuit card according to claim 11, wherein said dielectric material is a polymeric material.

17. The substrate for utilization in the construction of a multi-level circuit card according to claim 11, wherein each of said plurality of protrusions formed within said single conductive core and having a convex surface extending outward from said first surface of said single conductive core comprises a protrusion of at least one mil from said first surface of said single conductive core.

* * * * *